US006447978B1

(12) United States Patent
Leon et al.

(10) Patent No.: US 6,447,978 B1
(45) **Date of Patent: *Sep. 10, 2002**

(54) IMAGING MEMBER CONTAINING HEAT SWITCHABLE POLYMER AND METHOD OF USE

(75) Inventors: Jeffrey W. Leon, Rochester; James C. Fleming, Webster, both of NY (US)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/454,151

(22) Filed: Dec. 3, 1999

(51) Int. Cl.[7] ................................................ G03F 7/038

(52) U.S. Cl. .................... 430/270.1; 430/303; 430/348; 101/453; 101/467

(58) Field of Search ............................. 430/270.1, 303, 430/348; 101/453, 463.1, 467

(56) References Cited

U.S. PATENT DOCUMENTS

| | | | | |
|---|---|---|---|---|
| 4,034,183 A | | 7/1977 | Uhlig | 219/122 |
| 4,081,572 A | | 3/1978 | Pacansky | 427/53 |
| 4,405,705 A | | 9/1983 | Etoh et al. | 430/270 |
| 4,548,893 A | | 10/1985 | Lee et al. | 430/296 |
| 4,634,659 A | | 1/1987 | Esumi et al. | 430/302 |
| 4,693,958 A | | 9/1987 | Schwartz et al. | 430/302 |
| 5,512,418 A | | 4/1996 | Ma | 430/271.1 |
| 5,910,395 A | | 6/1999 | Li et al. | 430/302 |
| 5,922,512 A | | 7/1999 | DoMinh | 430/302 |
| 5,952,429 A | * | 9/1999 | Ikeda et al. | 525/326.1 |
| 6,083,663 A | * | 7/2000 | Vermeersch et al. | 430/302 |
| 6,153,352 A | * | 11/2000 | Oohashi et al. | 430/270.1 |
| 6,159,657 A | * | 12/2000 | Fleming et al. | 430/270.1 |
| 6,162,578 A | * | 12/2000 | Zheng et al. | 430/270.1 |
| 6,165,679 A | * | 12/2000 | Van Damme et al. | 430/270.1 |
| 6,165,691 A | * | 12/2000 | Damme et al. | 430/303 |
| 6,183,923 B1 | * | 2/2001 | Kato et al. | 430/96 |
| 6,190,830 B1 | * | 2/2001 | Leon et al. | 430/270.1 |
| 6,190,831 B1 | * | 2/2001 | Leon et al. | 430/270.1 |
| 6,242,155 B1 | * | 6/2001 | Yamasaki et al. | 430/270.1 |
| 6,365,705 B1 | * | 4/2002 | Leon | 528/289 |

FOREIGN PATENT DOCUMENTS

| | | |
|---|---|---|
| EP | 0 652 483 A1 | 5/1995 |
| EP | 0 924 102 A1 | 6/1999 |
| EP | 980754 | 2/2000 |
| EP | 1031412 | 8/2000 |
| WO | WO 92/09934 | 6/1992 |

* cited by examiner

*Primary Examiner*—Janet Baxter
*Assistant Examiner*—Barbara Gilmore
(74) *Attorney, Agent, or Firm*—Baker Botts LLP

(57) ABSTRACT

An imaging member, such as a negative-working printing plate or on-press cylinder, can be prepared using a hydrophilic imaging layer comprised of a heat-sensitive hydrophilic polymer that comprises recurring units comprising quaternary ammonium carboxylate groups. The imaging member can also include an infrared radiation sensitive material to provide added sensitivity to heat that can be supplied by laser irradiation in the IR region. The heat-sensitive polymer is considered "switchable" in response to heat, and provides a lithographic image without wet processing.

26 Claims, No Drawings

IMAGING MEMBER CONTAINING HEAT SWITCHABLE POLYMER AND METHOD OF USE

FIELD OF THE INVENTION

This invention relates in general to lithographic printing plates and specifically to lithographic printing plates that require no wet processing after imaging. The invention also relates to a method of digitally imaging such imaging members, and to a method of printing using them.

BACKGROUND OF THE INVENTION

The art of lithographic printing is based upon the immiscibility of oil and water, wherein an oily material or ink is preferentially retained by an imaged area and the water or fountain solution is preferentially retained by the non-imaged areas. When a suitably prepared negative working printing plate is moistened with water and ink is then applied the background or non-imaged areas retain the water and repel the ink while the imaged areas accept the ink and repel the water. The reverse holds true for positive working plates, in which the background is imaged. The ink is then transferred to the surface of a suitable substrate, such as cloth, paper or metal, thereby reproducing the image.

Very common lithographic printing plates include a metal or polymer support having thereon an imaging layer sensitive to visible or UV light. Both positive and negative-working printing plates can be prepared in this fashion. Upon exposure, and perhaps post-exposure heating, either imaged or non-imaged areas are removed using wet processing chemistries.

Thermally sensitive printing plates are less common, yet represent a steadily growing market. Currently, most of these plates utilize similar materials and similar imaging mechanisms as UV-imageable plates. For example, a thermal acid generator might be used in lieu of a photoacid generator and the same series of preheat and development steps might be employed. The main advantage of these digital plates is that the thermal imaging process is rapid and inexpensive compared to the analog process involving the creation of a mask and blanket UV exposure. Examples of such plates are described in U.S. Pat. No. 5,372,915 (Haley et al). They include an imaging layer comprising a mixture of dissolvable polymers and an infrared radiation absorbing compound. While these plates can be imaged using lasers and digital information, they require wet processing using alkaline developer solutions.

It has been recognized that a lithographic printing plate could be created by ablating an IR absorbing layer. For example, Canadian 1,050,805 (Eames) discloses a dry planographic printing plate comprising an ink receptive substrate, an overlying silicone rubber layer, and an interposed layer comprised of laser energy absorbing particles (such as carbon particles) in a self-oxidizing binder (such as nitrocellulose). Such plates were exposed to focused near IR radiation with a $Nd^{++}YAG$ laser. The absorbing layer converted the infrared energy to heat thus partially loosening, vaporizing or ablating the absorber layer and the overlying silicone rubber. The plate was developed by applying naphtha solvent to remove debris from the exposed image areas. Similar plates are described in *Research Disclosure* 19201, 1980 as having vacuum-evaporated metal layers to absorb laser radiation in order to facilitate the removal of a silicone rubber overcoated layer. These plates were developed by wetting with hexane and rubbing. $CO_2$ lasers are described for ablation of silicone layers by Nechiporenko & Markova, PrePrint 15th International IARIGAI Conference, June 1979, Lillehammer, Norway, Pira Abstract 02-79-02834. Typically, such printing plates require at least two layers on a support, one or more being formed of ablatable materials. Other publications describing ablatable printing plates include U.S. Pat. No. 5,385,092 (Lewis et al), U.S. Pat. No. 5,339,737 (Lewis et al), U.S. Pat. No. 5,353,705 (Lewis et al), U.S. Pat. No. Reissue 35,512 (Nowak et al) and U.S. Pat. No. 5,378,580 (Leenders).

While the noted printing plates used for digital, processless printing have a number of advantages over the more conventional photosensitive printing plates, there are a number of disadvantages with their use. The process of ablation creates debris and vaporized materials that must be collected. The laser power required for ablation can be considerably high, and the components of such printing plates may be expensive, difficult to coat, or unacceptable in resulting printing quality. Such plates generally require at least two coated layers on a support.

One approach toward non-process, non-ablation printing plates involves the use of "switchable polymers." These polymers will undergo thermally driven chemical reactions in which highly polar moieties are either created or destroyed under imaging conditions. This results in the storage of the imaging data as hydrophilic and hydrophobic regions of a continuous polymer surface. In addition to being not needing wet processing, such plates have the advantage of not needing any type of material collection devices which ablation-based plates require. Also unlike ablation plates, a switchable polymer plate in its ideal form would consist of one layer and can be manufactured on a single pass through a coating machine.

U.S. Pat. No. 4,034,183 (Uhlig) describes the use of high powered lasers to convert hydrophilic surface layers to hydrophobic surfaces. A similar process is described for converting polyamic acids into polyimides in U.S. Pat. No. 4,081,572 (Pacansky). The use of high-powered lasers is undesirable in the industry because of their power requirements and because of their need for cooling and frequent maintenance.

U.S. Pat. No. 4,634,659 (Esumi et al) describes imagewise irradiating hydrophobic polymer coatings to render exposed regions more hydrophilic in nature. While this concept was one of the early applications of converting surface characteristics in printing plates, it has the disadvantages of requiring long UV light exposure times (up to 60 minutes), and the plate's use is in a positive-working mode only.

U.S. Pat. No. 4,405,705 (Etoh et al) and U.S. Pat. No. 4,548,893 (Lee et al) describe amine-containing polymers for photosensitive materials used in non-thermal processes. The imaged materials also require wet processing after imaging.

Thermal processes using polyamic acids and vinyl polymers with pendant quaternary ammonium groups are described in U.S. Pat. No. 4,693,958 (Schwartz et al), but wet processing is required after imaging. In addition, the polyamic acid switchable polymers in this invention show low discrimination magnitude and the quaternary ammonium-based examples suffer from wash-off problems of both the foreground and the background.

U.S. Pat. No. 5,512,418 (Ma) describes the use of polymers having cationic quaternary ammonium groups that are heat-sensitive. However, like most of the materials described in the art, wet processing is required after imaging.

WO 92/09934 (Vogel et al) describes photosensitive compositions containing a photoacid generator and a polymer with acid labile tetrahydropyranyl or activated ester groups. However, imaging of these compositions converts the imaged areas from hydrophobic to hydrophilic in nature and the imaged areas are prone to scumming.

In addition, EP-A 0 652 483 (Ellis et al) describes lithographic printing plates imageable using IR lasers, and which do not require wet processing. These plates comprise an imaging layer that becomes more hydrophilic upon imagewise exposure to heat. This coating contains a polymer having pendant groups (such as t-alkyl carboxylates) that are capable of reacting under heat or acid to form more polar, hydrophilic groups. Imaging such compositions converts the imaged areas from hydrophobic to relatively more hydrophilic in nature, and thus requires imaging the background of the plate, which is generally a larger area. This can be a problem when imaging to the edge of the printing plate is desired. As with the plates described in WO 92/09934, the plates described in Ellis et al are also prone to scumming.

Although a number of switchable polymer-based printing plates are known, there remain technical barriers toward the utilization of this technology in commercially feasible products. Three difficulties commonly experienced in the design of switchable polymer-based plates are physical wear of the plates, and the related problems of background scumming and blanket toning.

"Physical wear" refers to the mechanical degradation of a printing plate during the printing process. Sufficient resistance to physical wear is often the major factor in determining whether or not a printing plate will be useful for press runs of very long length.

The problems of scumming (also known as "toning") and blanket toning typically result if ink-rejecting areas of the plate are not sufficiently polar. The uptake of ink in undesired areas of the plate results in the consequent undesirable transfer of ink to the final prints. This manifests itself as an unwanted gray or black color in background areas of the final prints. Scumming may occur in both negative-working plates (in nonimaged areas) and positive plates (in imaged areas). The related problem of blanket toning refers to the buildup of ink in the background areas of the printing press blanket cylinder. Excessive blanket toning results in the necessity of periodically stopping a press run to manually clean the ink from the blanket. This can have a negative impact on the productivity of a printing process.

In conventional developable printing plates, grained, anodized aluminum has proven to be a reliable background substrate. It is mechanically tough and shows little evidence of wear even on very long press runs. The material can also tolerate a wide range of press conditions without showing scumming or excessive blanket toning. Generally, the imaging process imparts a change in solubility to the imaged areas of the plate such that, after wet development, a grained, anodized aluminum surface is selectively exposed. Switchable polymer-based plates, however, are designed such that no portions of the imageable layer of the plate are removed. Thus the favorable background properties of an aluminum support substrate cannot be utilized. Not surprisingly, scumming behavior has been observed in many of the switchable polymer-based plates that have been reported in the patent literature.

In EP-A 0 924 102, it is reported that scumming may occur with some known printing plates containing switchable polymers in the imaging layers.

In switchable polymer-based printing plates, a major challenge lies in the creation of a synthetic polymer surface that has both adequate physical toughness and resistance to toning. In general, surfaces that reject ink well tend to be very highly hydrophilic and thus when exposed to an aqueous fountain solution they may be dissolved and lose adhesion to the support substrate. Alternatively, they may swell and become prone to abrasion and wear. It can be expected, then, that many of the synthetic polymer surfaces that are most resistant to toning will also have inherently inadequate physical properties for use in long-run printing plates. It is not uncommon that approaches to improve a switchable polymer plate's scumming behavior by increasing the hydrophilicity of the imageable layer will result in a consequent decrease in the wear resistance of the plate. Similarly, efforts to improve the physical toughness of a plate can result in an increase in scumming propensity.

SUMMARY OF THE INVENTION

The problems noted above are overcome by using a general class of heat-sensitive, switchable polymers that provide a good balance of physical toughness with resistance to scumming and blanket toning when incorporated into an imaging member. The switchable polymers can be obtained by simply reacting any of several carboxylic acid-containing polymers (or polymers containing equivalent groups, such as anhydrides) with a quaternary ammonium hydroxide. The heat-sensitive polymer, when formulated with a photothermal conversion material and preferably a crosslinking agent, provides a mechanically durable infrared radiation sensitive imaging member that exhibits excellent resistance to scumming and blanket toning.

One embodiment of the present invention is an imaging member comprising a support having thereon a hydrophilic imaging layer comprising a hydrophilic heat-sensitive polymer comprising recurring units that comprise quaternary ammonium carboxylate groups.

This invention also provides a method imaging comprising the steps of:

A) providing the imaging member described above, and

B) imagewise exposing the imaging member to energy to provide exposed and unexposed areas in the imaging layer and the imaging member, whereby the exposed areas are rendered more oleophilic than the unexposed areas by heat provided by the imagewise exposing.

In addition, the method of imaging can be extended to be a method of printing by following steps A and B with a further step of C) contacting the imagewise exposed imaging member with a fountain solution and a lithographic printing ink, and imagewise transferring the ink to a receiving material.

In a preferred embodiment of this invention, the ammonium ion contains one or more of the following substituents in such a way so as to complete four carbon-nitrogen bonds: substituted or unsubstituted benzyl groups, substituted or unsubstituted phenyl groups, five- or six-membered rings, and indoline or isoindoline rings.

In another embodiment of this invention, the use of specific ammonium ions alleviates the problem of malodorous emissions. When many common quaternary ammonium carboxylate polymers are subjected to thermal imaging, small molecule amines (such as trimethylamine when the benzyltrimethylammonium cation is used) are given off as reactive byproducts. Many of these amines are malodorous and possibly toxic. This problem has been alleviated using two approaches. The first approach is to utilize spiroquatemary ammonium cations in which the nitrogen is at the quaternary vertex of the intersecting rings. The second approach is to use specific cations that contain three or four benzyl groups or three or four hydroxyethyl groups.

The imaging member (for example, printing plates) of this invention have improved mechanical durability over other "switchable polymer" processless printing plates. The imaging member of this invention also exhibits substantially reduced blanket toning and reduced scumming. In some embodiments, the emission of malodorous gases is reduced. In addition, some of the polymers can be prepared easily using very inexpensive materials.

DETAILED DESCRIPTION OF THE INVENTION

The imaging members of this invention comprise a support and one or more layers thereon that are heat-sensitive. The support can be any self-supporting material including polymeric films, glass, ceramics, metals or stiff papers, or a lamination of any of these materials. The thickness of the support can be varied. In most applications, the thickness should be sufficient to sustain the wear from printing and thin enough to wrap around a printing form. A preferred embodiment uses a polyester support prepared from, for example, polyethylene terephthalate or polyethylene naphthalate, and having a thickness of from about 100 to about 310 μm. Another preferred embodiment uses aluminum foil having a thickness of from about 100 to about 600 μm. The support should resist dimensional change under conditions of use.

The support can also be a cylindrical surface having the heat-sensitive polymer composition thereon, and thus being an integral part of the printing press. The use of such imaged cylinders is described for example in U.S. Pat. No. 5,713,287 (Gelbart).

The support may be coated with one or more "subbing" layers to improve adhesion of the final assemblage. Examples of subbing layer materials include, but are not limited to, gelatin and other naturally occurring and synthetic hydrophilic colloids and vinyl polymers (such as vinylidene chloride copolymers) known for such purposes in the photographic industry, vinylphosphonic acid polymers, silicon-based sol-gel materials, such as those prepared from alkoxysilanes such as aminopropyltriethoxysilane or glycidoxypropyltriethoxysilane, titanium sol gel materials, epoxy functional polymers, and ceramics.

The backside of the support may be coated with antistatic agents and/or slipping layers or matte layers to improve handling and "feel" of the imaging member.

The imaging members, however, have preferably only one heat-sensitive layer that is required for imaging. This hydrophilic layer includes one or more heat-sensitive polymers, and optionally but preferably a photothermal conversion material (described below), and preferably provides the outer printing surface of the imaging member. Because of the particular polymer(s) used in the imaging layer, the exposed (imaged) areas of the layer are rendered more oleophilic in nature.

The heat-sensitive polymers useful in this invention comprise random recurring units at least some of which comprise quaternary ammonium salts of carboxylic acids. The polymers generally have a molecular weight of at least 3,000 Daltons and preferably of at least 20,000 Daltons.

The polymer randomly comprises one or more types of carboxylate-containing recurring units (or equivalent anhydride units) units identified as "A" below in Structure 1 and optionally one or more other recurring units (non-carboxylated) denoted as "B" in Structure 1.

The carboxylate-containing recurring units are linked directly to the polymer backbone which is derived from the "A" monomers, or are connected by spacer units identified as "X" in Structure 1 below. This spacer unit can be any divalent aliphatic, alicyclic or aromatic group that does not adversely affect the polymer's heat-sensitivity. For example, "X" can be a substituted or unsubstituted alkylene group having 1 to 16 carbon atoms (such as methylene, ethylene, isopropylene, n-propylene and n-butylene), a substituted or unsubstituted arylene group having 6 to 10 carbon atoms in the arylene ring (such as m- or p-phenylene and naphthylenes), substituted or unsubstituted combinations of alkylene and arylene groups (such arylenealkylene, arylenealkylenearylene and alkylenearylenealkylene groups), and substituted or unsubstituted N-containing heterocyclic groups. Any of these defined groups can be connected in a chain with one or more amino, carbonamido, oxy, thio, amido, oxycarbonyl, aminocarbonyl, alkoxycarbonyl, alkanoyloxy, alkanoylamino or alkaminocarbonyl groups. Particularly useful "X" spacers contains an ester or amide connected to an alkylene group or arylene group (as defined above), such as when the ester and amide groups are directed bonded to "A".

Structure 1

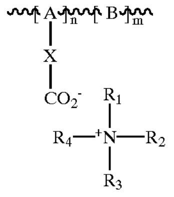

Additional monomers (non-carboxylate monomers) that provide the recurring units represented by "B" in Structure 1 above include any useful hydrophilic or oleophilic ethylenically unsaturated polymerizable comonomers that may provide desired physical or printing properties of the surface imaging layer or which provide crosslinkable functionalities. One or more "B" monomers may be used to provide these recurring units, including but not limited to, acrylates, methacrylates, styrene and its derivatives, acrylamides, methacrylamides, olefins, vinyl halides, and any monomers (or precursor monomers) that contain carboxy groups (that are not quatemized).

The quaternary ammonium carboxylate-containing polymer may be chosen or derived from a variety of polymers and copolymer classes including, but not necessarily limited to polyamic acids, polyesters, polyamides, polyurethanes, silicones, proteins (such as modified gelatins), polypeptides, and polymers and copolymers based on ethylenically unsaturated polymerizable monomers such as acrylates, methacrylates, acrylamides, methacrylamides, vinyl ethers, vinyl esters, alkyl vinyl ethers, maleic acid/anhydride, itaconic acid/anhydride, styrenics, acrylonitrile, and olefins such as butadiene, isoprene, propylene, and ethylene. A parent carboxylic acid-containing polymer (that is, one reacted to form quaternary ammonium carboxylate groups) may contain more than one type of carboxylic acid-containing monomer. Certain monomers, such as maleic acid/anhydride and itaconic acid/anhydride may contain more than one carboxylic acid unit. Preferably, the parent carboxylic acid-containing polymer is an addition polymer or copolymer containing acrylic acid, methacrylic acid, maleic acid or anhydride, or itaconic acid or anhydride or a conjugate base or hydrolysis product thereof.

In Structure 1, n represents about 25 to 100 mol % (preferably from about 50 to 100 mol %), and m represents 0 to about 75 mol % (preferably from 0 to about 50 mol %).

While Structure 1 could be interpreted to show polymers derived from only two ethylenically unsaturated polymerizable monomers, it is intended to include terpolymers and other polymers derived from more than two monomers.

The quaternary ammonium carboxylate groups must be present in the heat-sensitive polymer useful in this invention in such a quantity as to provide a minimum of one mole of the quaternary ammonium carboxylate groups per 1300 g of polymer and a maximum of one mole of quaternary ammonium carboxylate groups per 132 g of polymer. Preferably, this ratio (moles of quaternary ammonium carboxylate groups to grams of polymer) is from about 1:600 to about 1:132 and more preferably, this ratio is from about 1:500 to about 1:132. This parameter is readily determined from a knowledge of the molecular formula of a given polymer.

The quaternary ammonium counterion of the carboxylate functionalities may be any ammonium ion in which the nitrogen is covalently bound to a total of four alkyl or aryl substituents as defined below. In Structure 1 noted above, $R_1$, $R_2$, $R_3$ and $R_4$ are independently substituted or unsubstituted alkyl groups having 1 to 12 carbon atoms [such as methyl, ethyl, n-propyl, isopropyl, t-butyl, hexyl, hydroxyethyl, 2-propanonyl, ethoxycarbonymethyl, benzyl, substituted benzyl (such as 4-methoxybenzyl, o-bromobenzyl, and p-trifluoromethylbenzyl), and cyanoalkyl], or substituted or unsubstituted aryl groups having 6 to 14 carbon atoms in the carbocyclic ring (such as phenyl, naphthyl, xylyl, p-methoxyphenyl, p-methylphenyl, m-methoxyphenyl, p-chlorophenyl, p-methylthiophenyl, p-N,N-dimethylaminophenyl, methoxycarbonylphenyl and cyanophenyl). Alternatively, any two, three or four of $R_1$, $R_2$, $R_3$ and $R_4$ can be combined to form a ring (or two rings for four substituents) with the quaternary nitrogen atom, the ring having 5 to 14 carbon, oxygen, sulfur and nitrogen atoms in the ring. Such rings include, but are not limited to, morpholine, piperidine, pyrrolidine, carbazole, indoline and isoindoline rings. The nitrogen atom can also be located at the tertiary position of the fused ring. Other useful substituents for these various groups would be readily apparent to one skilled in the art, and any combinations of the expressly described substituents are also contemplated.

Alternatively, multi-cationic ionic species containing more than one quaternary ammonium unit covalently bonded together and having charges greater than +1 (for example +2 for diammonium ions, and +3 for triammonium ions) may be used in this invention.

Preferably, the nitrogen of the quaternary ammonium ion is directly bonded to one or more benzyl groups or one or two phenyl groups. Alternatively, the nitrogen atom is part of one or two five-membered rings, or one or two indoline or isoindoline rings and has a molecular weight of less than 400 Daltons.

The use of a spiro ammonium cation in which the nitrogen lies at the vertex of two intersecting rings is especially preferred. When a carboxylate polymer containing such an ammonium counterion is thermally imaged, small molecule amines are not given off and hence the problem of odor during imaging is alleviated. Similarly, the use of a benzyl-tris-hydroxyethyl ammonium ion may result in the release of triethanolamine that is odorless and relatively benign. This embodiment of the invention is also preferred.

The heat-sensitive polymers may be readily prepared using many methods that will be obvious to one skilled in the art. Many quaternary ammonium salts and carboxylic acid or anhydride-containing polymers are commercially available. Others can be readily synthesized using preparative techniques that would be obvious to one skilled in the art. The carboxylic acid or anhydride-containing polymers can be converted to the desired quaternary ammonium carboxylate salts by a variety of methods including, but not necessarily limited to:

1) the reaction of a carboxylic acid- or acid anhydride-containing polymer with the hydroxide salt of the desired quaternary ammonium ion,
2) the use of ion exchange resin containing the desired quaternary ammonium ion,
3) the addition of the desired ammonium ion to a solution of the carboxylic acid-containing polymer or a salt thereof followed by dialysis,
4) the addition of a volatile acid salt of the desired quaternary ammonium ion (such as an acetate or formate salt) to the carboxylic acid-containing polymer followed by evaporation of the volatile component upon drying,
5) electrochemical ion exchange techniques,
6) the polymerization of monomers containing the desired quaternary ammonium carboxylate units, and
7) the combination of a specific salt of the carboxylic acid-containing polymer and a specific quaternary ammonium salt, both chosen such that the undesired counterions will form an insoluble ionic compound in a chosen solvent and precipitate.

Preferably, the first method is employed.

Although it is especially preferred that all of the carboxylic acid (or latent carboxylic acid) functionalities of the polymer are converted to the desired quaternary ammonium salt, imaging compositions in which the polymer is incompletely converted may still retain satisfactory imageability. Preferably, at least 50 monomer percent of the carboxylic acid (or equivalent anhydride) containing monomers are reacted to form the desired quaternary ammonium groups.

In the preferred embodiments of this invention, the heat-sensitive polymer is crosslinked. Crosslinking can be provided in a number of ways. There are numerous monomers and methods for crosslinking that are familiar to one skilled in the art. Some representative crosslinking strategies include, but are not necessarily limited to:

1) the reaction of Lewis basic units (such as carboxylic acid, carboxylate, amine and thiol units within the polymer with a multifunctional epoxide-containing crosslinker or resin,
2) the reaction of epoxide units within the polymer with multifunctional amines, carboxylic acids, or other multifunctional Lewis basic unit,
3) the irradiative or radical-initiated crosslinking of double bond-containing units such as acrylates, methacrylates, cinnamates, or vinyl groups,
4) the reaction of multivalent metal salts with ligating groups within the polymer (the reaction of zinc salts with carboxylic acid-containing polymers is an example),
5) the use of crosslinkable monomers that react via the Knoevenagel condensation reaction, such as (2-acetoacetoxy)ethyl acrylate and methacrylate,
6) the reaction of amine, thiol, or carboxylic acid groups with a divinyl compound (such as bis(vinylsulfonyl) methane) via a Michael addition reaction,
7) the reaction of carboxylic acid units with crosslinkers containing multiple aziridine or oxazoline units,
8) the reaction of acrylic acid units with a melamine resin,
9) the reaction of diisocyanate crosslinkers with amines, thiols, or alcohols within the polymer,
10) mechanisms involving the formation of interchain sol-gel linkages [such as the use of the 3-(trimethylsilyl)propylmethacrylate monomer], 11) oxidative crosslinking using an added radical initiator (such as a peroxide or hydroperoxide), 12) autooxidative crosslinking, such as employed by alkyd resins, 13) sulfur vulcanization, and 14) processes involving ionizing radiation.

Ethylenically unsaturated polymerizable monomers having crosslinkable groups (or groups that can serve as attachment points for crosslinking additives) can be copolymerized with the other monomers as noted above. Such monomers include, but are not limited to, 3-(trimethylsilyl) propyl acrylate or methacrylate, cinnamoyl acrylate or methacrylate, N-methoxymethyl methacrylamide, N-aminopropylmethacrylamide hydrochloride, acrylic or methacrylic acid and hydroxyethyl methacrylate.

Preferably, crosslinking is provided by the addition of an epoxy-containing resin to the quaternary ammonium carboxylate polymer or by the reaction of a bisvinylsulfonyl compound with amine containing units (such as N-aminopropylmethacrylamide ) within the polymer. Most preferably, CR-5L (an epoxide resin sold by Esprit Chemicals) is used for this purpose.

The imaging layer of the imaging member can include one or more of such homopolymers or copolymers, with or without up to 50 weight % (based on total dry weight of the layer) of additional binder or polymeric materials that will not adversely affect its imaging properties.

The amount of heat-sensitive polymer(s) used in the imaging layer is generally at least 0.1 $g/m^2$, and preferably from about 0.1 to about 10 $g/m^2$ (dry weight). This generally provides an average dry thickness of from about 0.1 to about 10 $\mu$m.

The imaging layer can also include one or more conventional surfactants for coatability or other properties, dyes or colorants to allow visualization of the written image, or any other addenda commonly used in the lithographic art, as long as the concentrations are low enough so they are inert with respect to imaging or printing properties.

Preferably, the heat-sensitive imaging layer also includes one or more photothermal conversion materials to absorb appropriate radiation from an appropriate energy source (such as an IR laser), which radiation is converted into heat. Preferably, the radiation absorbed is in the infrared and near-infrared regions of the electromagnetic spectrum. Such materials can be dyes, pigments, evaporated pigments, semiconductor materials, alloys, metals, metal oxides, metal sulfides or combinations thereof, or a dichroic stack of materials that absorb radiation by virtue of their refractive index and thickness. Borides, carbides, nitrides, carbonitrides, bronze-structured oxides and oxides structurally related to the bronze family but lacking the $WO_{2.9}$ component, are also useful.

One particularly useful pigment is carbon of some form (for example, carbon black). Carbon blacks which are surface-functionalized with solubilizing groups are well known in the art and these types of materials are preferred photothermal conversion materials for this invention. Carbon blacks which are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are especially preferred.

Useful absorbing dyes for near infrared diode laser beams are described, for example, in U.S. Pat. No. 4,973,572 (DeBoer), incorporated herein by reference. Particular dyes of interest are "broad band" dyes, that is those that absorb over a wide band of the spectrum. Mixtures of pigments, dyes, or both, can also be used. Particularly useful infrared radiation absorbing dyes include those illustrated as follows:

IR Dye 1

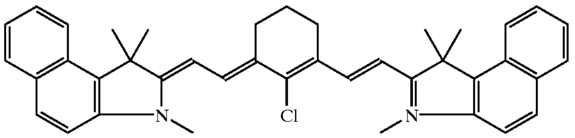

p-Toluenesulfate-

IR Dye 2

Same as Dye 1 but with chloride as the anion.

IR Dye 3

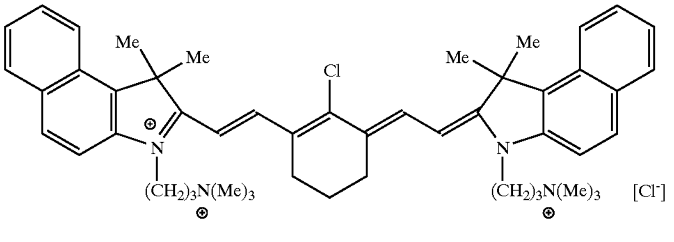

IR Dye 4

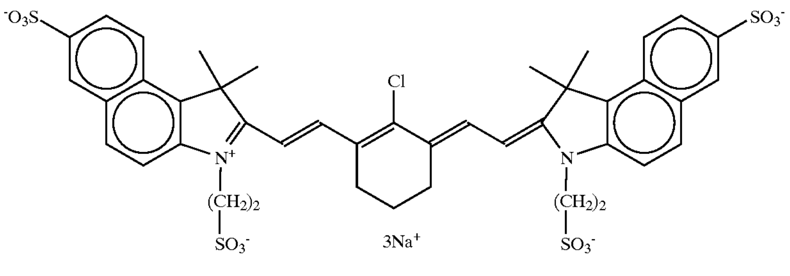

-continued

IR Dye 5

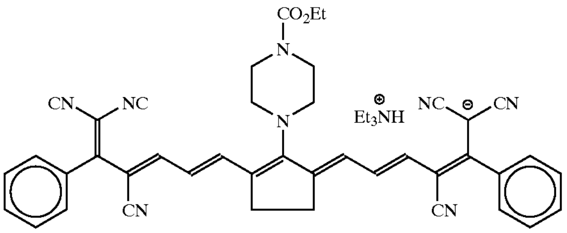

IR Dye 6

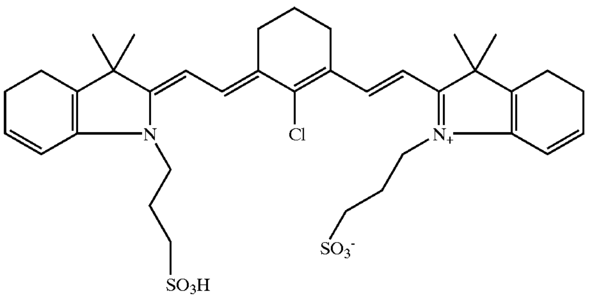

IR Dye 7

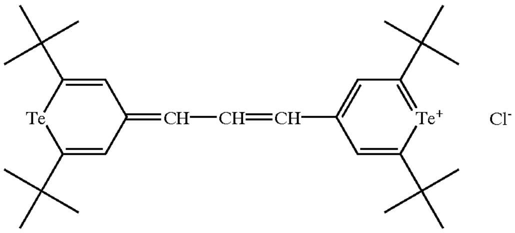

IR Dye 8

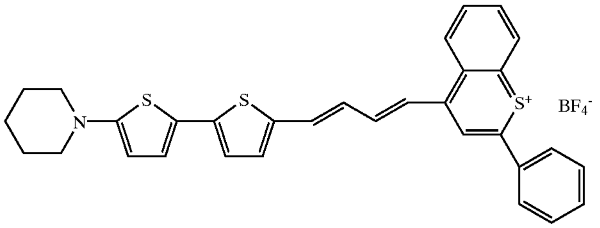

IR Dye 9

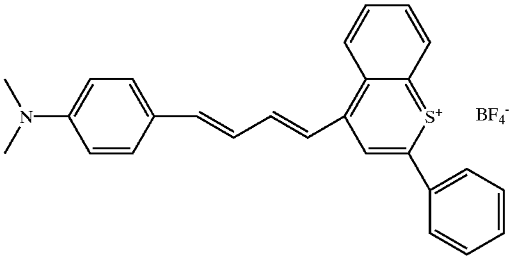

Useful oxonol compounds that are infrared radiation sensitive include Dye 5 noted above and others described in copending and commonly assigned U.S. Ser. No. 09/444,695, filed Nov. 22, 1999 by DoMinh et al and entitled "Thermal Switchable Composition and Imaging Member Containing Oxonol IR Dye and Methods of Imaging and Printing".

The photothermal conversion material(s) are generally present in an amount sufficient to provide an optical density of at least 0.3 (preferably of at least 0.5 and more preferably of at least 1.0) at the operating wavelength of the imaging laser. The particular amount needed for this purpose would be readily apparent to one skilled in the art, depending upon the specific material used.

Alternatively, a photothermal conversion material can be included in a separate layer that is in thermal contact with the heat-sensitive imaging layer. Thus, during imaging, the action of the photothermal conversion material can be transferred to the heat-sensitive polymer layer without the material originally being in the same layer.

The heat-sensitive composition can be applied to the support using any suitable equipment and procedure, such as spin coating, knife coating, gravure coating, dip coating or extrusion hopper coating. The composition can also be applied by spraying onto a suitable support (such as an on-press printing cylinder) as described in U.S. Pat. No. 5,713,287 (noted above).

The imaging members of this invention can be of any useful form including, but not limited to, printing plates, printing cylinders, printing sleeves and printing tapes (including flexible printing webs). Preferably, the imaging members are printing plates.

Printing plates can be of any useful size and shape (for example, square or rectangular) having the requisite heat-sensitive imaging layer disposed on a suitable support. Printing cylinders and sleeves are known as rotary printing members having the support and heat-sensitive layer in a cylindrical form. Hollow or solid metal cores can be used as substrates for printing sleeves.

During use, the imaging member of this invention is exposed to a suitable source of energy that generates or provides heat, such as a focused laser beam or a thermoresistive head, in the foreground areas where ink is desired in the printed image, typically from digital information supplied to the imaging device. No additional heating, wet processing, or mechanical or solvent cleaning is needed before the printing operation. A laser used to expose the imaging member of this invention is preferably a diode laser, because of the reliability and low maintenance of diode laser systems, but other lasers such as gas or solid state lasers may also be used. The combination of power, intensity and exposure time for laser imaging would be readily apparent to one skilled in the art. Specifications for lasers that emit in the near-IR region, and suitable imaging configurations and devices are described in U.S. Pat. No. 5,339,737 (Lewis et al), incorporated herein by reference. The imaging member is typically sensitized so as to maximize responsiveness at the emitting wavelength of the laser. For dye sensitization, the dye is typically chosen such that its $\lambda_{max}$ closely approximates the wavelength of laser operation.

The imaging apparatus can operate on its own, functioning solely as a platesetter, or it can be incorporated directly into a lithographic printing press. In the latter case, printing may commence immediately after imaging, thereby reducing press set-up time considerably. The imaging apparatus can be configured as a flatbed recorder or as a drum recorder, with the imaging member mounted to the interior or exterior cylindrical surface of the drum.

In the drum configuration, the requisite relative motion between the imaging device (such as a laser beam) and the imaging member can be achieved by rotating the drum (and the imaging member mounted thereon) about its axis, and moving the imaging device parallel to the rotation axis, thereby scanning the imaging member circumferentially so the image "grows" in the axial direction. Alternatively, the thermal energy source can be moved parallel to the drum axis and, after each pass across the imaging member, increment angularly so that the image "grows" circumferentially. In both cases, after a complete scan by the laser beam, an image corresponding to the original document or picture can be applied to the surface of the imaging member.

In the flatbed configuration, the laser beam is drawn across either axis of the imaging member, and is indexed along the other axis after each pass. Obviously, the requisite relative motion can be produced by moving the imaging member rather than the laser beam.

While laser imaging is preferred in the practice of this invention, imaging can be provided by any other means that provides thermal energy in an imagewise fashion. For example, imaging can be accomplished using a thermoresistive head (thermal printing head) in what is known as "thermal printing", described for example in U.S. Pat. No. 5,488,025 (Martin et al). Thermal print heads are commercially available (for example, as Fujitsu Thermal Head FTP-040 MCS001 and TDK Thermal Head F415 HH7-1089).

Without the need for any wet processing after imaging, printing can then be carried out by applying a lithographic ink and fountain solution to the imaging member printing surface, and then transferring the ink to a suitable receiving material (such as cloth, paper, metal, glass or plastic) to provide a desired impression of the image thereon. If desired, an intermediate "blanket" roller can be used to transfer the ink from the imaging member to the receiving material. The imaging members can be cleaned between impressions, if desired, using conventional cleaning means.

The following examples illustrate the practice of the invention, and are not meant to limit it in any way.

Preparation of Useful Switchable Polymers

Polymer 1

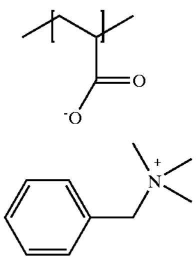

-continued

Polymer 2

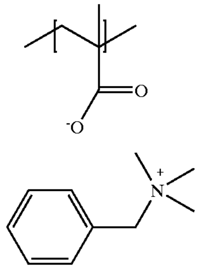

Polymer 3

19:1

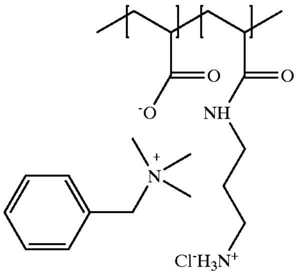

Polymer 4

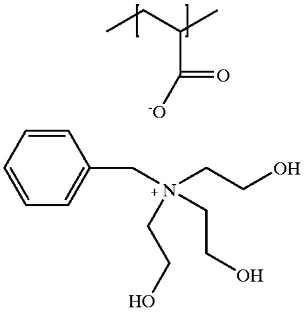

Polymer 5

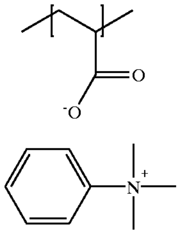

Polymer 6

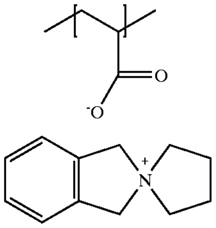

Polymer 7

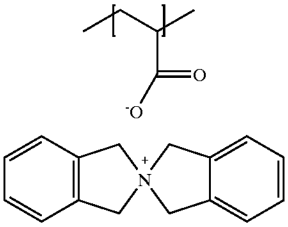

-continued

Polymer 8

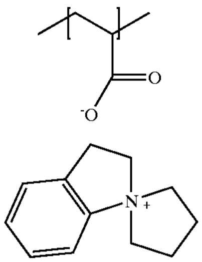

Polymer 9

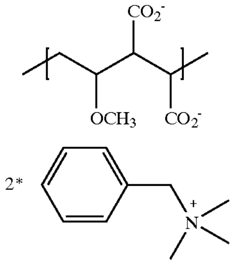

The polymers prepared as described below were characterized as having the ratio of moles of quaternary ammonium carboxylate groups to grams of polymer as shown in TABLE I below.

TABLE I

| Polymer | Ratio |
|---|---|
| 1 | 1:221 |
| 2 | 1:235 |
| 3 | 1:230 |
| 4 | 1:311 |
| 5 | 1:207 |
| 6 | 1:245 |
| 7 | 1:293 |
| 8 | 1:245 |
| 9 | 1:228 |

Preparation of Polymer 1 Solution

An aqueous solution [60.00 g of a 25% (w/w)] of polyacrylic acid (available from Polysciences, MW ~90,000) was combined with 60.0 g distilled water and 84.63 g of a 41.5% (w/w) methanolic solution of benzyltrimethylammonium hydroxide (Aldrich Chemical). A gummy precipitate initially formed and was slowly redissolved over 30 minutes. The resulting polymer was stored as a 32% (w/w) solution in a water/methanol mixture.

Preparation of Polymer 2 Solution

A sample (3.00 g) of polymethacrylic acid (available from Polysciences, MW ~30,000) was combined with 23.00 g of distilled water and 14.04 of a 41.5% (w/w) methanolic solution of benzyltrimethylammonium hydroxide (Aldrich Chemical). A gummy precipitate initially formed and was slowly redissolved over 30 minutes. The resulting polymer was stored as a 21% (w/w) solution in a water/methanol mixture.

Preparation of Polymer 3 Solution

A] A nitrogen-degassed solution of acrylic acid (1.00 g) and 3-aminopropylmethacrylamide hydrochloride (0.13 g) in water (10 ml) were added gradually over one hour using syringe pump to a rapidly stirring, nitrogen degassed solution of 2,2'-azobis(2-methylpropionamidine) dihydrochloride (0.056 g) in water (20 ml) at 60° C. The reaction solution was allowed to stir at 60° C. for an additional one hour and was then precipitated into acetonitrile. The solids were collected by vacuum filtration and dried in a vacuum oven at 60° C. overnight to afford 0.85 g of the product copolymer as a white powder.

B] A methanolic solution [4.7 ml of a 40% (w/w)] of benzylltrimethylammonium hydroxide (Aldrich Chemical) was added to a solution of the copolymer from step A (0.85 g) in 8.5 ml of distilled water. A gummy precipitate initially formed and was slowly redissolved over 30 minutes. The solution was diluted with water to a total volume of 23 ml (9.2% solids).

Preparation of Polymer 4 Solution

A] Benzyl tris(hydroxyethyl)ammonium bromide (26.78 g, synthesized by the procedure of Rengan et al (*J.Chem.Soc.Chem.Commun.,* 10, 1992, 757) was dissolved in 250 ml of methanol and 5 ml water in a 500 ml round bottomed flask. Silver (I) oxide (20.56 g) was added and the mixture was stirred at room temperature for 72 hours. The insolubles were filtered off and the filtrates were concentrated to 80 ml by rotary evaporation. The clear solution was passed through a flash chromatography column packed with 300 $cc^3$ DOWEX® 550A OH resin using methanol eluent and concentrated to ~50 ml by rotary evaporation. The concentration of hydroxide anion in the solution was determined to be 1.353. meq/g by HCl titration.

B] A 25% (w/w) aqueous solution (12 g) of polyacrylic acid (available from Polysciences, MW ~90,000) was combined with 13.30 g of methanol and 30.75 g of the solution from step A. The resulting polymer was stored as a 25% (w/w) solution in a water/methanol mixture.

Preparation of Polymer 5 Solution

An aqueous solution [8.00 g of a 25% (w/w)] of polyacrylic acid (Polysciences, MW ~90,000) was combined with 10.00 g methanol and 12.31 g of a 2.254 meq/g (38.5% w/w) methanolic solution of phenyltrimethylammonium hydroxide (available from TCI America). A gummy precipitate initially formed and was slowly redissolved over 30 minutes. The resulting polymer was stored as a 21% (w/w) solution in a water/methanol mixture.

Preparation of Polymer 6 Solution

A] Pyrrolidine (48.93 g, Aldrich Chemical) was added using an addition funnel over 30 minutes to a solution of α,α'-dibromo-o-xylene (45.40 g, Aldrich Chemical) in diethyl ether (408 g). A white precipitate formed almost immediately. The solvent was decanted from the precipitated solid and the crude product was recrystallized from isopropanol, washed three times with diethyl ether, and dried overnight in a vacuum oven at 60° C. to afford a very hygroscopic powder. The purified product was stored as a solution in methanol of 25.4% solids.

B] The product solution of step A was combined in a 500 ml round bottomed flask with 9:1 methanol:water (130 ml) and silver (I) oxide (16.59 g). The flask grew slightly warm and the silver (I) oxide turned from black to a dull gray. The reaction solution was allowed to stir for an hour at room temperature and the insolubles were filtered off. The filtrates were passed through a flash chromatography column packed with 300 $cm^3$ of DOWEX® 550A OH resin using a methanol eluent. The collected fractions were concentrated to a weight of 36 g by rotary evaporation. The concentration of hydroxide anion was determined to be 2.218 meq/g by HCl titration.

C] An aqueous solution [12.00 g of a 25% (w/w)] of polyacrylic acid (Polysciences, MW ~90,000) was combined with 11.44 g of methanol and 18.77 g of the solution from step B. A gummy precipitate initially formed and was slowly redissolved over 30 minutes. The resulting polymer was stored as an 18% (w/w) solution in a water/methanol mixture.

Preparation of Polymer 7 Solution

A] Anhydrous ammonia (Aldrich) was bubbled through a rapidly stirring suspension of α,α'-dibromo-o-xylene (26.36 g, Aldrich Chemical) in absolute ethanol (300 ml) for 2.5 hours. The reaction mixture was placed in a freezer for 2 hours and then filtered. The collected white solids were washed once with isopropanol and once with diethyl ether to afford 7.95 g of the quaternary ammonium bromide product as fine, white crystals.

B] A sample (7.39 g) of the product from step A was converted from the bromide to the hydroxide using 5.65 g silver (I) oxide and 70 ml of a 9:1 methanol:water mixture in an analogous manner as used for Polymer 6 (Step B). A solution (14.50 g) of 1.452 meq/g of hydroxide anion was obtained.

C] An aqueous solution [5.02 g of a 25% (w/w)] of polyacrylic acid (Polysciences, MW ~90,000) was combined with 14.14 g of methanol and 12.00 g of the solution from step B. A gummy precipitate initially formed and was slowly redissolved over 30 minutes. The resulting polymer was stored as a 16% (w/w) solution in a water/methanol mixture.

Preparation of Polymer 8 Solution

A] Indoline (Aldrich, 14.06 g), 1,4-bromobutane (Aldrich, 25.48 g) and ammonium hydroxide (28% aqueous solution, Aldrich, 45.0 g) were combined in a 500 ml round bottomed flask fitted with an addition funnel and a condenser. The reaction mixture was heated to reflux and 23.0 g of additional ammonium hydroxide solution were added dropwise over 30 minutes. The reaction solution was heated at reflux overnight and the liquids were evaporated from the crude product using a rotary evaporator. The remaining brown solids were dissolved in hot isopropanol and filtered hot to remove residual ammonium bromide. The filtrates were concentrated to an orange oil, dissolved in 200 ml methanol, adsorbed onto about 100 $cm^3$ silica gel, and loaded onto the top of a flash chromatography column packed with about 1000 $cm^3$ of silica gel. The column was first eluted with 1:1 ethyl acetate:hexane to remove an organic-soluble impurity, and then with methanol to elute the desired product. The collected methanolic solution was concentrated to a yellowish oil on a rotary evaporator to provide 15.0 g of the purified spiro-indolinium bromide salt.

B] All of the purified product from Step A was dissolved in 150 ml of a 9:1 methanol:water mixture. It was then converted to the corresponding hydroxide salt with silver (I) oxide (27.34 g) in an analogous manner as used for Polymer 6 (Step B). A solution (41.9 g) of 1.300 meq/g of hydroxide anion was obtained.

C] A 25% (w/w) aqueous solution (5 g) of polyacrylic acid (Polysciences, MW ~90,000) was combined with 13.34 g of the solution from step B. A gummy precipitate initially formed and was slowly redissolved over 30 minutes. The resulting polymer was stored as a 23.28% (w/w) solution in a water/methanol mixture.

Preparation of Polymer 9 Solution

GANTREZ® AN-139 polymer (ISP Technologies, 1.00 g) was added to a solution comprising distilled water (10 g) and 5.36 g of a 40% (w/w) aqueous solution of benzyltrimethylammonium hydroxide (Aldrich Chemical). The resulting mixture was stirred vigorously for 12 hours at which point a clear, homogeneous solution of 17.80% (w/w) had formed.

EXAMPLE 1

Printing Plate Prepared Using Polymer 1

A coating formulation was prepared comprising Polymer 1 solution (3.74 g), CR-5L (0.12 g, an epoxy resin sold by Esprit Chemicals), FLUORAD FC-135 cationic surfactant (0.024 g of a 50% solution in isopropanol, 3M Co.), FX-GE-003 (1.80 g, a 10% dispersion of polymer-grafted carbon black manufactured by Nippon Shokubai), methanol (9.66 g) and water (0.66 g). These components were stirred vigorously in a glass jar for approximately one hour and coated on a mechanically grained and anodized aluminum support at a wet coverage of 2.36 ml/$ft^2$ (25.5 ml/$m^2$) that was sufficient to provide a dry coverage of 100 mg/$ft^2$ (1.08 g/$m^2$) of polymer, 15 mg/ft2 (162 mg/$m^2$) of carbon black, and 10 mg/$ft^2$ (108 mg/$m^2$) of CR-5L. The resulting printing plates were dried in an oven at 100° C. for 20 minutes to provide mechanically durable, black imaging layers.

The printing plates were then exposed on a platesetter (similar to the commercially available CREO TRENDSETTER™, but smaller in size) having an array of laser diodes operating at a wavelength of 830 nm each focused to a spot diameter of 23 μm. Each channel provided a maximum of 356 mW of power incident on the recording surface. The printing plates were mounted on a drum whose rotation speed was varied to provide for a series of images set at various exposures as listed in TABLE II below. The laser beams were modulated to produce halftone dot images.

TABLE II

| IMAGE | IMAGING POWER (mW) | IMAGING EXPOSURE (mJ/$cm^2$) |
|---|---|---|
| 1 | 356 | 360 |
| 2 | 356 | 450 |
| 3 | 356 | 600 |
| 4 | 356 | 900 |

The imaged printing plates were mounted on a commercial A.B. Dick 9870 duplicator press and paper prints were made using VanSon Diamond Black lithographic printing ink and Universal Pink fountain solution containing PAR alcohol substitute (Varn Products Company). It was apparent that the printing plates produced solid images of good quality at the two higher exposure levels. The background showed no scumming and no blanket toning or wear was observed over the press run of 2,000 impressions.

EXAMPLE 2

Printing Plate Prepared Using Polymer 2

Printing plates were prepared, imaged, and used for printing as described in Example 1. The imaging layer coating formulation comprised the Polymer 2 solution (5.68 g), CR-5L (0.12 g), FLUORAD FC-135 cationic surfactant (0.024 g), FX-GE-003 (1.80 g), methanol (8.69 g) and water (8.69 g).

Upon printing, the plates produced solid images of good quality at the two higher exposure levels. The background showed no scumming and no blanket toning or wear was observed over the press run of 2,000 impressions.

EXAMPLE 3

Printing Plate Prepared Using Polymer 3

A coating formulation was prepared comprising the Polymer 3 solution (11.04 g), CAB-O-JET® 200 (0.51 g, a 20% dispersion of anionically functionalized carbon black sold by the Cabot Co.), bis(vinylsulfonyl)methane (1.26 g of a 1.8% solution in water), methanol (5.39 g) and water (1.80 g). The components were combined in a vial and zirconium beads were added to half the height of the vial. This mixture was roll-milled overnight and coated on a gelatin-subbed polyethylene terephthalate support with a wet coverage of 2.36 ml/$ft^2$ (25.5 ml/$m^2$) that was sufficient to afford a dry coverage of 100 mg/ft$^2$ (1.08 g/m$^2$) of polymer and 10 mg/ft$^2$ (108 mg/m$^2$) of carbon black. The printing plates were dried in a convection oven at 80° C. for 4 minutes.

The printing plates were then imaged and run on press as described in Example 1. Upon printing, the plates produced solid images of good quality at the highest exposure level. The background showed no scumming and no blanket toning was observed over the press run of 1,000 impressions.

EXAMPLE 4

Printing Plate Prepared Using Polymer 4

Printing plates were prepared, imaged and used on press as described in Example 1. The coating formulation comprised the Polymer 4 solution (4.76 g), CR-5L (0.12 g), FLUORAD FC-135 cationic surfactant (0.024 g), FX-GE-003 (1.80 g), methanol (9.15 g) and water (9.15 g). The imaging exposure series is shown in TABLE III below.

The printing plates produced solid images of good quality at the higher two exposure levels. The background showed no scumming and no blanket toning or wear was observed over the press run of 2,000 impressions.

TABLE III

| IMAGE | IMAGING POWER (mW) | IMAGING EXPOSURE (mJ/cm$^2$) |
|---|---|---|
| 1 | 356 | 602 |
| 2 | 356 | 722 |
| 3 | 356 | 901 |
| 4 | 356 | 1200 |

EXAMPLE 5

Printing Plate Prepared from Polymer 5

Printing plates were prepared as described in Example 1 except that the printing plates were cured at 80° C. for 10 minutes. The imaging layer coating formulation comprised the Polymer 5 solution (5.83 g), CR-5L (0.12 g), FLUORAD FC-135 cationic surfactant (0.024 g), FX-GE-003 (1.80 g), methanol (8.62 g) and water (8.62 g).

The resulting printing plates were imaged in the same manner as described in Example 4 and used for printing in the same manner as described in Example 1. The printing plates produced solid images of good quality at all exposure levels. No wear was observed over the press run of 2000 impressions. To test plate resilience and resistance to scumming, the ink setting on the A.B. Dick duplicator press was maintained at 3 while the fountain solution setting was slowly decreased from 20 (its standard setting) to 12. The background remained very clean until a setting of 14 was reached. As the fountain level was restored to 20, the plates rapidly cleared up and continued to provide good quality impressions.

EXAMPLE 6

Printing Plate Prepared Using Polymer 6

Printing plates were prepared as described in Example 1. The imaging layer coating formulation comprised the Polymer 6 solution (6.73 g), CR-5L (0.12 g), FLUORAD FC-135 cationic surfactant (0.024 g), FX-GE-003 (1.80 g), methanol (8.16 g) and water (8.16 g).

The printing plates were imaged as described in Example 4 and used for printing as described in Example 1. They provided solid images of good quality at the three highest exposure levels. No scumming, blanket toning, or wear was observed over the press run of 2000 impressions.

In another press run, the ink setting on the A.B. Dick duplicator press was maintained at 3 while the fountain setting was slowly decreased from 20 (its standard setting) to 12 in order to test plate resilience and resistance to scumming. The background remained very clean until a setting or 14 was reached. As the fountain level was restored to 20, the printing plates rapidly cleared up and continued to provide good quality impressions.

EXAMPLE 7

Printing Plate Prepared Using Polymer 7

Printing plates were prepared as described in Example 1 except that the plate was cured at 80° C. for 20 minutes. The imaging layer coating formulation comprised the Polymer 7 solution (7.30 g), CR-5L (0.12 g), FLUORAD FC-135 cationic surfactant (0.024 g), FX-GE-003 (1.80 g), methanol (7.88 g) and water (7.88 g).

The printing plates were imaged as described in Example 4 and used for printing as described in Example 1. The printing plates provided solid images of good quality at all exposure levels. No wear was observed over the press run of 2000 impressions. To test plate resilience and resistance to scumming, the ink setting on the A.B. Dick duplicator press was maintained at 3 while the fountain setting was slowly decreased from 20 (its standard setting) to 12. The background remained very clean until a setting or 14 was reached. As the fountain level was restored to 20, the printing plates rapidly cleared up and continued to provide good quality impressions.

EXAMPLE 8

Printing Plate Prepared Using Polymer 8

Printing plates were prepared in an identical manner as described in Example 1 except that they were cured at 80° C. for 3.5 minutes. The imaging layer coating formulation comprised the Polymer 8 solution (5.12 g), CR-5L (0.12 g), FC-135 (0.024 g), FX-GE-003 (1.80 g), methanol (8.95 g) and water (8.95 g).

The plates were imaged in the same manner as described in Example 4 and run on press in the same manner as described in Example 1. They produced solid images of good quality at all exposure levels. No wear was observed over the press run of 2000 impressions. To test plate resilience and resistance to scumming, the ink setting on the A.B. Dick duplicator press was maintained at 3 while the fountain setting was slowly decreased from 20 (its standard setting) to 12. The background remained very clean until a setting or 14 was reached. As the fountain level was restored to 20, the plates rapidly cleared up and continued to print good quality impressions.

EXAMPLE 9

Printing Plate Prepared Using Polymer 9

Printing plates were prepared in an identical manner as described in Example 1 except that they were cured at 80° C. for 5 minutes. The imaging layer coating formulation comprised the Polymer 9 solution (6.74 g), CR-5L (0.12 g), FC-135 (0.024 g), FX-GE-003 (1.80 g), methanol (8.16 g) and water (8.16 g).

The plates were imaged in the same manner as described in Example 4 and run on press in the same manner as described in Example 1. They produced solid images of good quality at all exposure levels. No wear was observed over the press run of 2000 impressions.

The invention has been described in detail with particular reference to preferred embodiments thereof, but it will be understood that variations and modifications can be effected within the spirit and scope of the invention.

We claim:

1. An imaging member comprising a support having thereon a hydrophilic imaging layer comprising a crosslinked hydrophilic heat-sensitive polymer comprising repeating units comprising quaternary ammonium carboxylate groups.

2. The imaging member of claim 1 further comprising a photothermal conversion material.

3. The imaging member of claim 2 wherein said photothermal conversion material is an infrared radiation absorbing material and is present in said imaging layer.

4. The imaging member of claim 2 wherein said photothermal conversion material comprises carbon black or is an infrared radiation absorbing dye.

5. The imaging member of claim 4 wherein said carbon black is a polymer-grafted or anionic surface-functionalized carbon black.

6. The imaging member of claim 1 wherein said support is a polyester or aluminum support.

7. The imaging member of claim 1 wherein the polymer is crosslinked by reacting the polymer with a crosslinking agent.

8. The imaging member of claim 1 wherein said heat-sensitive polymer comprises at least 1 mole of quaternary ammonium carboxylate groups per 1300 g of polymer.

9. The imaging member of claim 8 wherein said heat-sensitive polymer comprises from about 1 mole of quaternary ammonium carboxylate groups per 1300 g of polymer to about 1 mole of quaternary ammonium carboxylate groups per 132 g of polymer.

10. The imaging member of claim 1 wherein said heat-sensitive polymer is represented by Structure 1 below wherein "A" represents recurring units derived from ethylenically unsaturated polymerizable monomers, X is an optional spacer group, $R_1$, $R_2$, $R_3$, and $R_4$ are independently alkyl or aryl groups, or any two, three or four of $R_1$, $R_2$, $R_3$, and $R_4$ can be combined to form one or two heterocyclic rings with the charged nitrogen atom, and B represents non-carboxylated recurring units, m is 0 to about 75 mol %, and n is from about 25 to 100 mol %

Structure 1

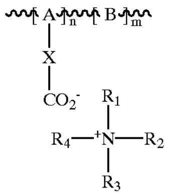

11. The imaging member of claim 10 wherein any two, three or four of $R_1$, $R_2$, $R_3$, and $R_4$ are combined to form one or two heterocyclic rings with the charged nitrogen atom.

12. The imaging member of claim 11 wherein the heterocyclic rings are indoline or isoindoline rings.

13. The imaging member of claim 10 wherein at least one of $R_1$, $R_2$, $R_3$, or $R_4$ is a substituted or unsubstituted benzyl or phenyl group.

14. The imaging member of claim 10 wherein m is from 0 to 75 mol %, and said B recurring units are derived from at least some additional ethylenically unsaturated polymerizable monomers having unreacted carboxy groups, acid anhydride groups or a conjugate base thereof.

15. The imaging member of claim 10 wherein m is from 0 to about 50 mol %, and said B recurring units are derived from at least some additional ethylenically unsaturated polymerizable monomers having unreacted carboxy groups, acid anhydride units or a conjugate base thereof.

16. The imaging member of claim 15 wherein one of said additional monomers is acrylic acid, methacrylic acid, maleic anhydride or a conjugate base or a hydrolysis product thereof.

17. The imaging member of claim 1 wherein said imaging layer is the sole layer on said support.

18. The imaging member of claim 1 wherein said support is an on-press printing cylinder.

19. A method of imaging comprising the steps of

A) providing the imaging member of claim 1, and

B) imagewise exposing said imaging member to energy to provide exposed and unexposed areas in the imaging layer of said imaging member, whereby said exposed areas are rendered more oleophilic than said unexposed areas by heat provided by said imagewise exposing.

20. The method of claim 19 wherein said imaging member further comprises a photothermal conversion material, and imagewise exposing is carried out using an IR radiation emitting laser.

21. The method of claim 19 wherein said imagewise exposing is carried out using a thermoresistive head.

22. The method of claim 19 wherein said imaging member is provided in step A by spraying said heat-sensitive polymer onto a cylindrical support.

23. A method of printing comprising the steps of:

A) providing the imaging member of claim 1,

B) imagewise exposing said imaging member to energy to provide exposed and unexposed areas in the imaging layer of said imaging member, whereby said exposed areas are rendered more oleophilic than said unexposed areas by heat provided by said imagewise exposing, and C) contacting said imagewise exposed imaging member with a fountain solution and a lithographic printing ink, and imagewise transferring said ink to a receiving material.

24. The imaging member of claim 1 wherein the polymer is reacted with an epoxy-containing resin to provide crosslinking to said hydrophilic heat-sensitive polymer.

25. The imaging member of claim 1 wherein said heat-sensitive polymer comprises spiro-quatemary ammonium cations that are any one of the following cations:

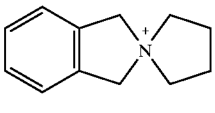

,

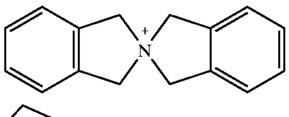

or

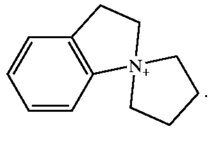

.

26. The imaging member of claim 1 wherein the heat sensitive crosslinked vinyl polymer is any one of:

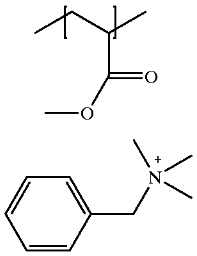 ;
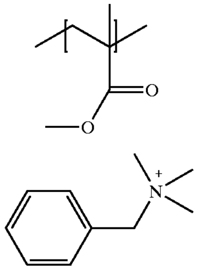 ;
19:1
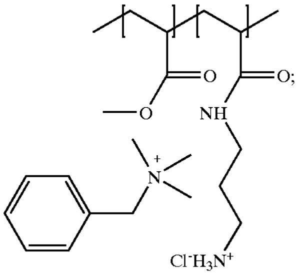
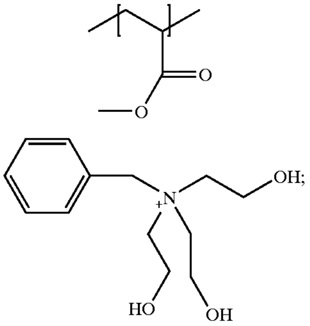
-continued
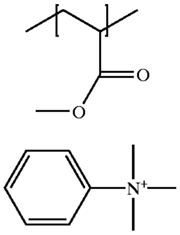 ;
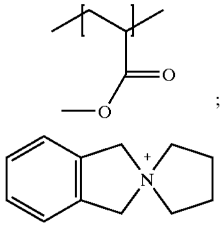 ;
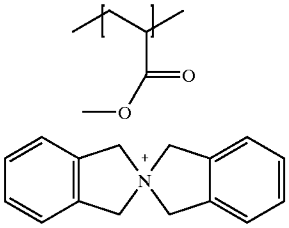 ;
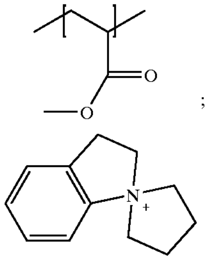 ;
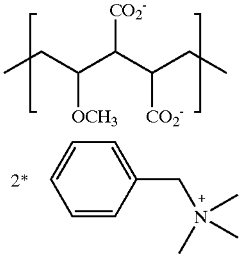
or the mixture of any of these.
* * * * *